US012568756B2

(12) United States Patent
Yang et al.

(10) Patent No.: US 12,568,756 B2
(45) Date of Patent: Mar. 3, 2026

(54) DISPLAY PANEL MOTHERBOARD AND MANUFACTURING METHOD THEREOF

(71) Applicant: KunShan Go Visionox Opto Electronics Co., Ltd, Kunshan (CN)

(72) Inventors: Kai Yang, Kunshan (CN); Xue Cui, Kunshan (CN); Mingxing Liu, Kunshan (CN); Weili Li, Kunshan (CN); Wenxing Li, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 769 days.

(21) Appl. No.: 17/868,027

(22) Filed: Jul. 19, 2022

(65) Prior Publication Data

US 2022/0352264 A1     Nov. 3, 2022

Related U.S. Application Data

(63) Continuation of application No. PCT/CN2021/095719, filed on May 25, 2021.

(30) Foreign Application Priority Data

Jul. 24, 2020     (CN) ......................... 202010728399.0

(51) Int. Cl.
*H10K 59/88*          (2023.01)
*H01L 21/66*          (2006.01)
*H01L 23/544*         (2006.01)

(52) U.S. Cl.
CPC ............. *H10K 59/88* (2023.02); *H01L 22/20* (2013.01); *H01L 22/24* (2013.01); *H01L 23/544* (2013.01)

(58) Field of Classification Search
CPC .... H10K 59/88; H10K 71/00; H10K 59/1201; H10K 71/70; H01L 23/544; H01L 22/12; H01L 22/24; H01L 22/30
(Continued)

(56) References Cited

U.S. PATENT DOCUMENTS

2007/0052119 A1* 3/2007 Sakai ................ G02F 1/133516
                                                          264/1.7
2016/0343944 A1* 11/2016 Lee ........................ H10K 59/35
(Continued)

FOREIGN PATENT DOCUMENTS

CN          101566583 A      10/2009
CN          102651457        7/2015
(Continued)

OTHER PUBLICATIONS

Translated specification of JP-2007227204-A (Year: 2007).*
(Continued)

*Primary Examiner* — Jacob Y Choi
(74) *Attorney, Agent, or Firm* — Maier & Maier, PLLC

(57)          ABSTRACT

The application provides a display panel motherboard and manufacturing method thereof. The display panel motherboard includes display panel forming areas distributed in an array and a test area adjacent to the display panel forming areas. The display panel motherboard includes an array mother substrate; a light-emitting layer, disposed on a surface of a side of the array mother substrate and located in the display panel forming areas; and a test component, disposed on the surface of the array mother substrate and located in the test area, the test component including a test block including a fluorescent layer, disposed on the surface of the array mother substrate and emitting light upon being irradiated by activation light; a target test layer, disposed on the side of the fluorescent layer facing away from the surface;
(Continued)

and a positioning reference portion, disposed at a peripheral side of the target test layer.

10 Claims, 5 Drawing Sheets

(58) Field of Classification Search
USPC ........................................................ 257/40
See application file for complete search history.

(56) References Cited

U.S. PATENT DOCUMENTS

| | | | |
|---|---|---|---|
| 2018/0292311 A1 | 10/2018 | Boamfa et al. | |
| 2020/0220117 A1 | 7/2020 | Cheon et al. | |
| 2022/0028335 A1* | 1/2022 | Matsueda | G09G 3/3233 |

FOREIGN PATENT DOCUMENTS

| | | | | |
|---|---|---|---|---|
| CN | 105511126 | | 4/2016 | |
| CN | 106524922 A | | 3/2017 | |
| CN | 107302010 A | | 10/2017 | |
| CN | 107369701 A | | 11/2017 | |
| CN | 108600612 A | | 9/2018 | |
| CN | 105511126 B | | 11/2018 | |
| CN | 110379840 A | | 10/2019 | |
| CN | 111326560 A | * | 6/2020 | G09G 3/3233 |
| CN | 111834244 | | 10/2020 | |
| CN | 112838106 | | 5/2021 | |
| JP | 2007227204 A | * | 9/2007 | |

OTHER PUBLICATIONS

Translated specification of CN-111326560-A (Year: 2020).*
International Search Report (with English Translation) mailed on Aug. 18, 2021, in corresponding International Application No. PCT/CN2021/095719; 12 pages.
Chinese Office Action issued on Oct. 8, 2021 in corresponding CN Application No. 202010728399.0; 15 pages.
Chinese Office Action issued on Jan. 26, 2022 in corresponding CN Application No. 202010728399.0; 8 pages.
Notification to Grant Patent Right issued on Mar. 29, 2022 in corresponding CN Application No. 202010728399.0; 6 pages.

* cited by examiner

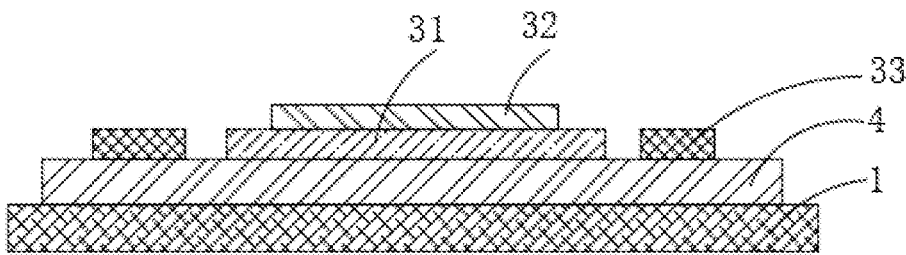

Fig. 5

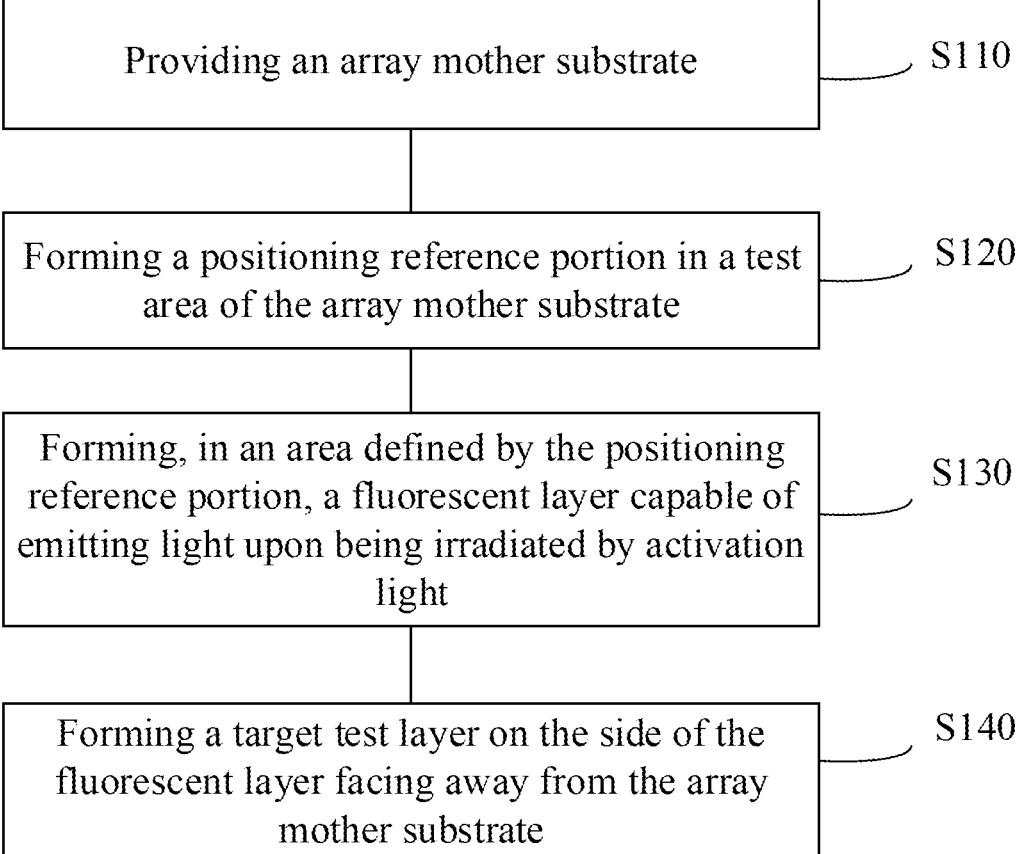

| Providing an array mother substrate | S110 |

| Forming a positioning reference portion in a test area of the array mother substrate | S120 |

| Forming, in an area defined by the positioning reference portion, a fluorescent layer capable of emitting light upon being irradiated by activation light | S130 |

| Forming a target test layer on the side of the fluorescent layer facing away from the array mother substrate | S140 |

Fig. 6

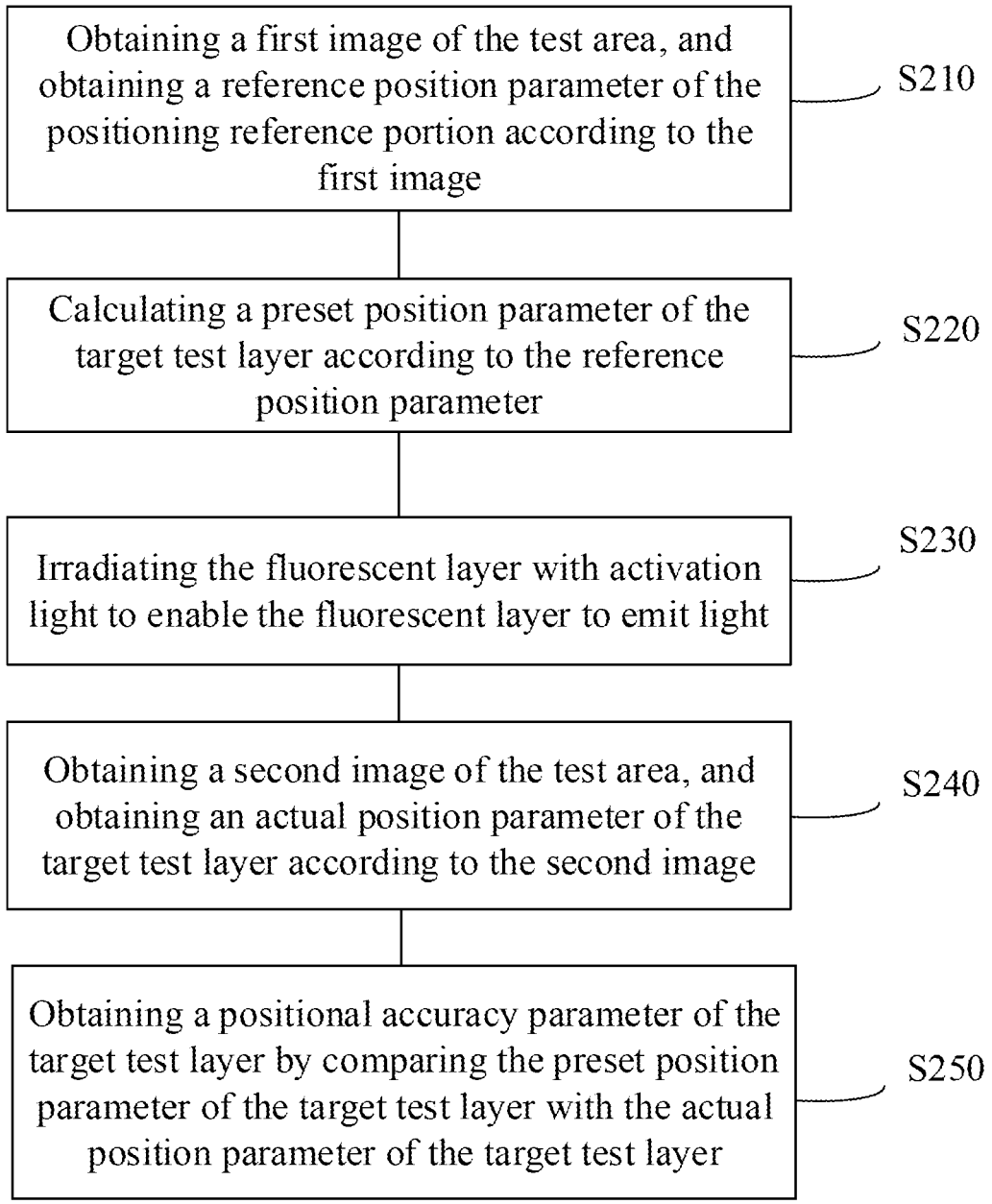

Obtaining a first image of the test area, and obtaining a reference position parameter of the positioning reference portion according to the first image — S210

Calculating a preset position parameter of the target test layer according to the reference position parameter — S220

Irradiating the fluorescent layer with activation light to enable the fluorescent layer to emit light — S230

Obtaining a second image of the test area, and obtaining an actual position parameter of the target test layer according to the second image — S240

Obtaining a positional accuracy parameter of the target test layer by comparing the preset position parameter of the target test layer with the actual position parameter of the target test layer — S250

Fig. 7

DISPLAY PANEL MOTHERBOARD AND MANUFACTURING METHOD THEREOF

CROSS-REFERENCE TO RELATED APPLICATIONS

The present application is a continuation of International Application No. PCT/CN2021/095719 filed on May 25, 2021, which claims the priority to Chinese patent application No. 202010728399.0 filed on Jul. 24, 2020, both of which are incorporated herein by reference in their entireties.

TECHNICAL FIELD

The present application belongs to the technical field of electronic products, and relates particularly to a display panel motherboard and a manufacturing method thereof.

BACKGROUND

Organic Light Emitting Display (OLED) display devices, as flat panel display devices, are widely used in various consumer electronic products, such as mobile phones, televisions, and personal digital assistants, digital cameras, notebooks computers, and desktop computers etc., and have become the mainstream of display devices, due to their advantages of high image quality, power saving, thin bodies, wide application ranges, and the like.

Since there is a requirement of under-screen camera function for an existing OLED product, it has become increasingly urgent to improve transmittance of an OLED screen. Currently, it is hard to meet a design requirement of under-screen camera for most companies, because transmittance of a screen is low due to entire surface evaporation of a cathode. Therefore, it is necessary to use a Fine Metal Mask (FMM) for evaporating a cathode. However, if the FMM is used for evaporating the cathode, the present measurement point scheme cannot measure the positional accuracy of cathode evaporation, because when the positional accuracy of the FMM is monitored on-line, position measurement points must be grasped under fluorescence, but the cathode does not emit light under fluorescence.

Therefore, there is an urgent need for a new display panel motherboard and a manufacturing method thereof.

SUMMARY

The present application provides a display panel motherboard and a manufacturing method thereof. There will be a contrast of light and dark between a fluorescent layer and a target test layer when the fluorescent layer is emitting light, and thus an actual position outline of the target test layer is brought out, so as to accurately obtain the actual position of the target test layer and determine the positional accuracy of the target test layer when it is formed.

In a first aspect, the present application provides a display panel motherboard including a plurality of display panel forming areas distributed in an array and a test area adjacent to the display panel forming areas. The display panel motherboard includes an array mother substrate; a light-emitting layer, disposed on a surface of a side of the array mother substrate and located in the display panel forming areas; and a test component, disposed on the surface of the array mother substrate and located in the test area, the test component including a test block including: a fluorescent layer, disposed on the surface of the array mother substrate and emitting light upon being irradiated by activation light; a target test layer, disposed on the side of the fluorescent layer facing away from the surface of the array mother substrate, and an orthographic projection of the fluorescent layer on the test area covering an orthographic projection of the target test layer on the test area; and a positioning reference portion, disposed at a peripheral side of the target test layer.

The display panel motherboard provided by the embodiment of the present application includes the array mother substrate, light-emitting layer and test component. The test component includes the fluorescent layer, target test layer and positioning reference portion. A predetermined disposing position of the target test layer is determined via the positioning reference portion, and then the fluorescent layer and the target test layer are formed. Since the target test layer itself does not emit light, an actual disposing position of the target test layer cannot be determined accurately. Therefore, the fluorescent layer is disposed on the side of the target test layer next to the array mother substrate 1. The fluorescent layer can emit light upon being irradiated by the activation light, and the orthographic projection of the fluorescent layer on the test area A covers the orthographic projection of the target test layer on the test area A, so that there will be a contrast of light and dark between the fluorescent layer and the target test layer when the fluorescent layer is emitting light, and thus an actual position outline of the target test layer is brought out, so as to obtain the actual position of the target test layer accurately. The positional accuracy of the target test layer when it is formed can be determined by comparing the actual position of the target test layer with the predetermined disposing position of the target test layer determined via the positioning reference portion, which provides data reference for forming the light-emitting layer on the display panel forming areas and improves the positional accuracy for forming the light-emitting layer.

BRIEF DESCRIPTION OF THE DRAWINGS

FIG. 5 is a diagram showing a film structure of a test block of an embodiment of the present application;

FIG. 6 is a flowchart of a method for manufacturing a display panel motherboard according to an embodiment of the present application; and FIG. 7 is flowchart of an accuracy detection step of an embodiment of the present application.

DETAILED DESCRIPTION

Features and exemplary embodiments of various aspects of the present application will be described in details below. In order to make the objects, technical solutions and advantages of the present application clearer, the present application is further described in details below with reference to the accompany drawings and specific embodiments. It should be understood that the specific embodiments described herein are only for illustration of the present application, and are not for limiting the present application.

For those skilled in the art, the present application can be implemented without some of those specific details. The below description of embodiments is only for providing better understanding of the present application by showing examples of the present application.

For a better understanding of the present application, a display panel motherboard and a manufacturing method thereof according to embodiments of the present application will be described in details with reference to FIGS. 1-7.

Figure 1:
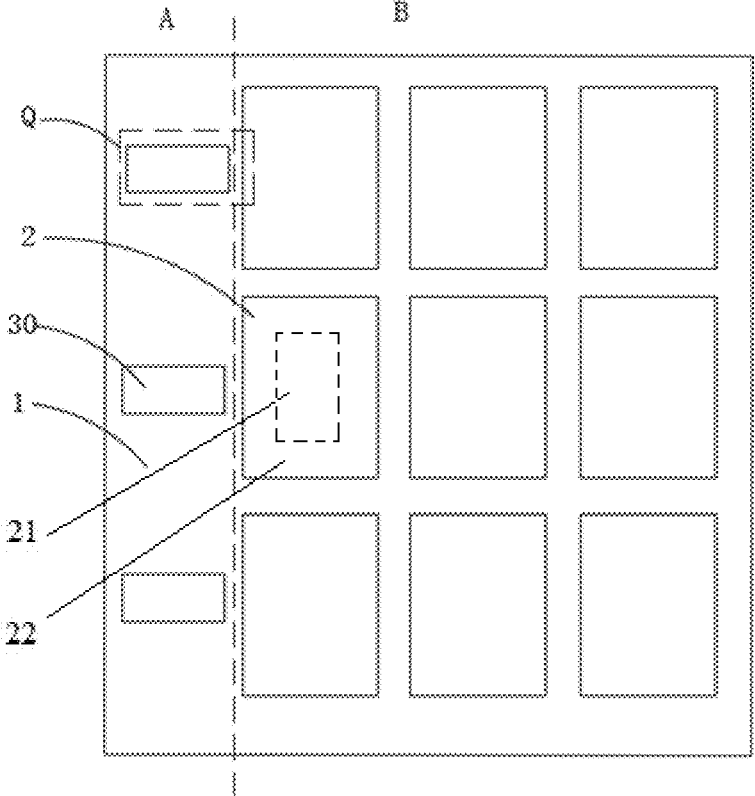
FIG. 1 is a schematic structural diagram of a display panel motherboard according to an embodiment of the present application.
Figure 2:
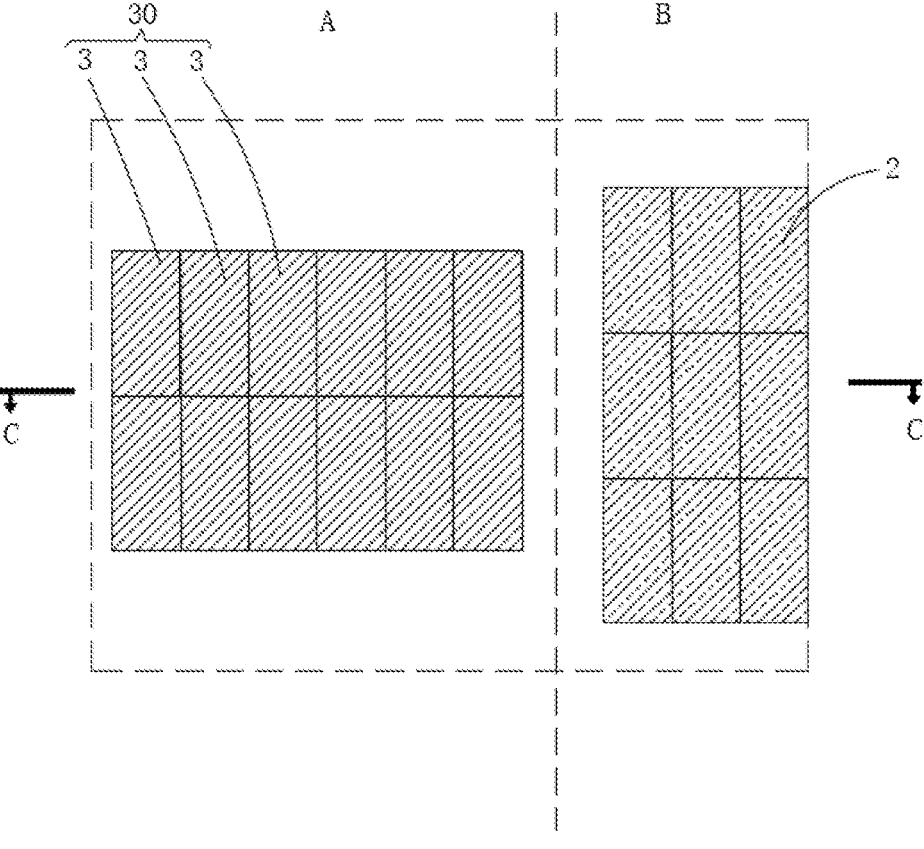
FIG. 2 is a schematic diagram of a partially enlarged view of a Q region in FIG. 1.
Figure 3:
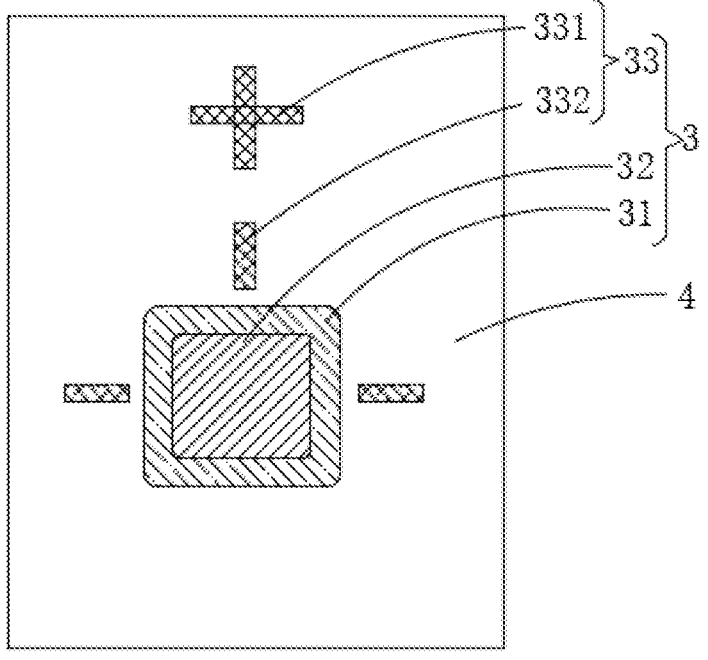
FIG. 3 is a schematic structural diagram of a test block of an embodiment of the present application.

FIG. 1 shows a schematic structural diagram of a display panel motherboard of an embodiment of the present application; FIG. 2 shows a schematic diagram of a partially enlarged view of a Q region in FIG. 1; and FIG. 3 shows a schematic structural diagram of a test block of an embodiment of the present application. As shown in FIGS. 1-3, an embodiment of the present application provides a display panel motherboard. The display panel motherboard includes display panel forming areas B distributed in an array and a test area A adjacent to the display panel forming areas B. The display panel motherboard includes an array mother substrate 1; a light-emitting layer 2, disposed on a surface of a side of the array mother substrate 1 and located in each of the display panel forming areas B; and a test component 30, disposed on the surface of the array mother substrate 1 and located in the test area A. The test component includes a test block 3. The test block 3 includes a fluorescent layer 31, disposed on the surface of the array mother substrate 1 and emitting light upon being irradiated by activation light; a target test layer 32, disposed on the side of the fluorescent layer 31 facing away from the surface, and an orthographic projection of the fluorescent layer 31 on the test area A covering an orthographic projection of the target test layer 32 on the test area A; and a positioning reference portion 33, disposed at a peripheral side of the target test layer 32.

The display panel motherboard provided by the embodiment of the present application includes the array mother substrate 1, light-emitting layer 2 and test component 30. The test component 30 includes the fluorescent layer 31, target test layer 32 and positioning reference portion 33. A predetermined disposing position of the target test layer 32 is determined via the positioning reference portion 33, and then the fluorescent layer 31 and the target test layer 32 are formed. Since the target test layer 32 itself does not emit light, an actual disposing position of the target test layer 32 cannot be determined accurately. Therefore, the fluorescent layer 31 is disposed on the side of the target test layer 32 next to the array mother substrate 1. The fluorescent layer 31 can emit light upon being irradiated by the activation light, and the orthographic projection of the fluorescent layer 31 on the test area A covers the orthographic projection of the target test layer 32 on the test area A, so that there will be a contrast of light and dark between the fluorescent layer 31 and the target test layer 32 when the fluorescent layer 31 is emitting light, and thus an actual position outline of the target test layer 32 is brought out, so as to obtain the actual position of the target test layer 32 accurately. The positional accuracy of the target test layer 32 when it is formed can be determined by comparing the actual position of the target test layer 32 with the predetermined disposing position of the target test layer 32 determined via the positioning reference portion 33, which provides data reference for forming the light-emitting layer 2 on the display panel forming areas B and improves the positional accuracy for forming the light-emitting layer 2.

It should be noted that, as shown in FIG. 2 that is a schematic diagram of a partially enlarged view of the Q region in FIG. 1, the test area A is disposed adjacently to the display panel forming areas B. Particularly, the test area A may be disposed around the display panel forming areas B, or may be disposed along one side of the display panel forming areas B. An area of the test area A is usually smaller than or equal to an area of the display panel forming areas B.

The array mother substrate 1 may be a substrate at any stage in the process for manufacturing the display panel motherboard, which has an underlayment and some layer structures formed on the underlayment. The specific structure of the substrate is not limited in the present application. The array mother substrate 1 may specifically include device layers and a substrate. The device layers may refer to some functional film layers formed on the substrate. For example, the functional film layers may include a source, gate, and drain of a thin film transistor. Correspondingly, some test components 30 similar to the functional film layers of the device layers may be formed in the test area A. The test components 30 in the test area A may be tested to reflect the positional accuracy or other characteristics of the light-emitting layer 2 in the display panel forming area B.

In some optional embodiments, the light-emitting layer 2 may include an electron injection layer, an electron transport layer, an organic light-emitting layer, a hole transport layer, and a hole injection layer. Materials forming the fluorescent layer 31 may include at least one of materials constituting the electron injection layer, materials constituting the electron transport layer, materials constituting the organic light-emitting layer, materials constituting the hole transport material layer, and materials constituting the hole injection layer It should be noted that the materials constituting the electron injection layer, the electron transport layer, the organic light-emitting layer, the hole transport layer, and the hole injection layer generally include fluorescent materials, and thus can emit light under activation light. Therefore, in order to reduce process and material costs, the fluorescent layer 31 can be formed by using the materials constituting the electron injection layer, the electron transport layer, the organic light-emitting layer, the hole transport layer or the hole injection layer. Since the fluorescent layer 31 does not need to realize functions such as display, only one layer of the fluorescent layer 31 needs to be disposed, as long as it can emit light under the activation light.

In order to further improve the test accuracy of the test component 30, in some optional embodiments, the light-emitting layer 2 may include a first display area 21 and a second display area 22 disposed at least partially around the first display area 21. A pixel density of the first display area 21 may be less than a pixel density of the second display area 22. The test component 30 may include a plurality of test blocks 3. Some test blocks 3 of the plurality of test blocks 3 may form a first test group, and a distribution density of the test blocks 3 in the first test group may be equivalent to the pixel density of the first display area 21. The other test blocks 3 of the plurality of test blocks 3 may form a second test group, and a distribution density of the test blocks 3 in the second test group may be equivalent to the pixel density of the second display area 22.

It can be understood that the first display area usually has optical devices disposed therein, and it is for purpose of improving a light-transmitting area of the first display area that the pixel density of the first display area is set to be less than the pixel density of the second display area. In a solution where the optical devices are provided under a screen, disposing the optical devices in the first display area can increase an amount of light received by the optical devices In order to simulate the deposing form of the light-emitting layer 2 more realistically and enable the measured positional accuracy of the test component 30 to be closer to the actual positional accuracy of the light-emitting layer 2, the test component 30 may include the plurality of test blocks 3; some test blocks 3 of the plurality of test blocks 3 may form the first test group, and the distribution density of the test blocks 3 in the first test group may be equivalent to the pixel density of the first display area; and the other test blocks 3 of the plurality of test blocks 3 may form the second test group, and the distribution density of the test blocks 3 in the second test group may be equivalent to the pixel density of the second display area.

The entire test component 30 includes the plurality of test blocks 3, so that more data samples are measured and the positional accuracy of the target test layer 32 when formed can be improved efficiently by a method for processing data, such as averaging. Moreover, the distribution density of the test blocks 3 in the first test group and the distribution density of the test blocks 3 in the second test group are set to be equivalent to the pixel density of the first display area and the pixel density of the second display area, respectively, so as to simulate the arrangement of each pixel of the light-emitting layer 2 realistically and enable the positional accuracy of the target test layer 32 measured by the test component 30 to be closer to the positional accuracy of a film layer corresponding to the target test layer 32 in the light-emitting layer 2, which may specifically be a patterned film layer such as a cathode layer and an anode layer.

As shown in FIG. 3, in some optional embodiments, the positioning reference portion 33 may include a first positioning component and a second positioning component spaced apart from each other. The first positioning component may include at least one first positioning portion 331 formed as a cross, and the second positioning component may include a plurality of second positioning portions 332 each formed as a line It should be noted that, the first positioning portion 331 formed as a cross is specifically for purpose of facilitate positioning the test component 30 by an external image obtaining portion for testing. It is in order to determine a preset formation position for the target test layer 32 that the second positioning component includes at least two second positioning portions 332 each formed as a line. Specifically, an intersection point of extension lines of the two second positioning portions 332 along a first direction and a second direction respectively may be set as a preset center point of the target test layer 32. The first direction and the second direction are perpendicular to each other.

Alternatively, there may be three second positioning portions 332 that are distributed in a triangle layout, so as to determine a disposing angle of the target test layer 32 with reference to the array mother substrate 1.

Figure 4:
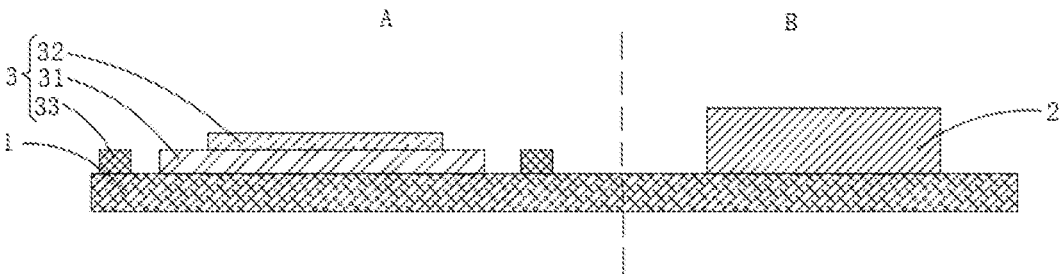
FIG. 4 is a diagram showing a film structure at C in FIG. 2.

As shown in FIG. 3 and FIG. 4, in some optional embodiments, the target test layer 32 may include a cathode material layer. A distance from edges of a projection of the cathode material layer on the array mother substrate 1 to corresponding edges of a projection of the fluorescent layer on the array mother substrate 1 as measured anywhere is constant, and the array mother substrate 1 has at least one of the second positioning portions 332 provided at any position next to each edge of the cathode material layer.

It should be noted that the target test layer 32 may include the cathode material layer, which may specifically refer to a film layer made of the same materials as the cathode layer of the light-emitting layer 2. Since the cathode layer of the light-emitting layer 2 is evaporated using a fine mask (FMM), it is necessary to measure the positional accuracy of the evaporation of the cathode layer. Therefore, the evaporation of the cathode material layer is applied to simulate the evaporation of the cathode layer of the light-emitting layer 2, so as to determine the positional accuracy of the evaporation when the fine mask is used. According to the test result, the fine mask or another device may be improved, enabling the positional accuracy of the evaporation of the cathode layer to meet the accuracy requirement.

In order to ensure that the light emitted by the fluorescent layer 31 can evenly highlight the cathode material layer, optionally, the projection of the cathode material layer on the array mother substrate 1 may be a tetragonum (e.g., a square). The distance from edges of the tetragonum projection of the cathode material layer on the array mother substrate 1 to corresponding edges of the projection of the fluorescent layer 31 on the array mother substrate 1 as measured anywhere is constant, i.e., the fluorescent layer 31 is a tetragonum whose side length is longer than that of the cathode material layer. A center point of the cathode material layer coincides with a center point of the fluorescent layer 31. The cathode material layer has at least one of the second positioning portions 332 provided near each edge thereof, that is, one corresponding second positioning portion 332 is provided at the outer side of the edge of each of the four sides of the cathode material layer, so as to improve the accuracy of a preset evaporation position of the cathode material layer as determined by the second positioning portions 332.

As shown in FIG. 5, in some optional embodiments, an anode material layer 4 may be further included. The anode material layer 4 is disposed on the side of the fluorescent layer 31 facing away from the target test layer 32. An orthographic projection of the anode material layer 4 on the test area A may cover the orthographic projection of the fluorescent layer 31 on the test area A.

It can be understood that, similarly to the cathode material layer, the anode material layer 4 specifically refers to a film layer made of the same materials as the anode layer of the light-emitting layer 2 to simulate the anode layer of the light-emitting layer 2. The orthographic projection of the anode material layer 4 on the test area A may cover the orthographic projection of the fluorescent layer 31 on the test area A, that is, the anode material layer 4 may serves as the substrate of the entire test component 30 to highlight the fluorescent layer 31 and the target test layer 32 during testing. Optionally, the positioning reference portion 33 may be made of pixel definition materials, i.e., a portion made of the same materials as a pixel definition layer of the light-emitting layer 2.

As shown in FIG. 6, an embodiment of the present application further provides a method for manufacturing a display panel motherboard, which may be applied to the above-mentioned display panel motherboard. The method includes:

S110: providing an array mother substrate 1;

S120: forming a positioning reference portion 33 in the test area A of the array mother substrate 1;

S130: forming, in an area defined by the positioning reference portion 33, a fluorescent layer 31 capable of emitting light upon being irradiated by activation light; and S140: forming a target test layer 32 on the side of the fluorescent layer 31 facing away from the array mother substrate 1.

In the step of S110, the array mother substrate 1 may be a substrate at any stage in the process for manufacturing the display panel motherboard, which has an underlayment and some layer structures formed on the underlayment. A specific structure of the array mother substrate 1 is not limited in the present application.

In the step of S120, forming the positioning reference portion 33 in the test area A of the array mother substrate 1 is for purpose of determining a preset formation position for the target test layer 32 later by the disposing position of the positioning reference portion 33.

In the step of S130, because the fluorescent layer 31 should emit light to highlight the target test layer 32, and the formation position of the target test layer 32 is determined by the positioning reference portion 33, the fluorescent layer 31 is disposed in the area defined by the positioning reference portion 33, so that the target test layer 32 can be disposed on the fluorescent layer 31 later.

In the step of S140, the target test layer 32 is formed on the side of the fluorescent layer 31 facing away from the array mother substrate 1. Specifically, an orthographic projection of the fluorescent layer 31 on the test area A covers an orthographic projection of the target test layer 32 on the test area A, to ensure that the fluorescent layer 31 can highlight the target test layer 32 when it emits light, so as to determine the actual position of the target test layer 32 accurately.

In the method for manufacturing the display panel motherboard of the embodiment of the present application, the fluorescent layer 31 is formed on the side of the target test layer 32 next to the array mother substrate 1, and the fluorescent layer 31 can emit light upon being irradiated by the activation light, so that there will be a contrast of light and dark between the fluorescent layer 31 and the target test layer 32 when the fluorescent layer 31 is emitting light, and thus an actual position outline of the target test layer 32 is brought out, so as to obtain the actual position of the target test layer 32 accurately. The positional accuracy of the target test layer 32 when it is formed can be determined by comparing the actual position of the target test layer with the preset formation position of the target test layer 32 determined via the positioning reference portion 33.

As shown in FIG. 7, after the step of forming the target test layer 32 on the side of the fluorescent layer 31 facing away from the array mother substrate 1, an accuracy detection step may be further included. The accuracy detection step may include:

S210: obtaining a first image of the test area A, and obtaining a reference position parameter of the positioning reference portion 33 according to the first image;

S220: calculating a preset position parameter of the target test layer 32 according to the reference position parameter;

S230: irradiating the fluorescent layer 31 with activation light to enable the fluorescent layer 31 to emit light;

S240: obtaining a second image of the test area A, and obtaining an actual position parameter of the target test layer 32 according to the second image; and S250: obtaining a position accuracy parameter of the target test layer 32 by comparing the preset position parameter of the target test layer 32 with the actual position parameter of the target test layer 32.

In the step of S210, the first image of the test area A of the display panel motherboard may be obtained by an image obtaining portion, and the reference position parameter of the positioning reference portion 33 may be obtained according to the first image. The image obtaining portion may specifically be an apparatus capable of capturing images, such as an industrial camera. The reference position parameter of the positioning reference portion 33 may specifically be abscissa and ordinate values with reference to an origin point defined on the array mother substrate 1.

In the step of S220, the preset position parameter of the target test layer 32 of the display panel motherboard is calculated according to the reference position parameter. The reference position parameter may include specifically a reference abscissa value and a reference ordinate value. The preset position parameter may be obtained according to the reference abscissa value and the reference ordinate value. It should be noted that the reference abscissa value and the reference ordinate value refer to a reference abscissa value of a positioning reference portion 33 and a reference ordinate value of another positioning reference portion 33, rather than coordinate values of the same positioning reference part 33, that is, the positioning reference portion 33 may be used to determine the abscissa of the preset position parameter of the target test layer 32, and the another positioning reference portion 33 may be used to determine the ordinate of the preset position parameter of the target test layer 32, and a combination of the abscissa and the ordinate may constitute the coordinate of the center point of the target test layer 32.

In the step of S230, the fluorescent layer 31 of the display panel motherboard is irradiated with activation light to enable the fluorescent layer 31 to emit light. The activation light may specifically be a light source emitting red light or blue light etc.

In the step of S240, the actual position parameter of the target test layer 32 of the display panel motherboard is obtained according to the second image. The actual position parameter may specifically be abscissa and ordinate values with reference to an origin point defined on the array mother substrate 1.

In the step of S250, the position accuracy parameter of the target test layer 32 is obtained by comparing the preset position parameter of the target test layer 32 with the actual position parameter of the target test layer 32. Afterwards, the position accuracy parameter may be used to adjust a part (such as a fine mask) used to form the target test layer 32, to adjust the positional accuracy of the target test layer 32 when it is formed, enabling it to meet the production requirements.

In the method for manufacturing the display panel motherboard of the embodiment of the present application, the fluorescent layer 31 is provided to generate a contrast of light and dark with the target test layer 32, so that an actual position outline of the target test layer 32 is brought out, so as to obtain the actual position of the target test layer 32 accurately, which can be compared with the preset formation position of the target test layer 32 to determine the positional accuracy of the target test layer 32 when it is formed.

In some optional embodiments, after the accuracy detection step, the method may further include forming a light-emitting layer 2 corresponding to each display panel forming area B on a surface of a side of the array mother substrate 1.

The positional accuracy of the target test layer 32 when it is formed can be determined by the accuracy detection step, the positional accuracy of the target test layer 32 can be adjusted by adjusting the part (such as the fine mask) used to form the target test layer 32 enabling it to meet the production requirements, and after that, the part (such as the fine mask) meeting the production requirements may be used to form the light-emitting layer 2 corresponding to each display panel forming area B on the surface of the side of the array mother substrate 1, to improve the positional accuracy of a corresponding film layer of the light-emitting layer 2 when it is formed.

The above provides only specific implementations of the present application, and those skilled in the art can clearly understand that, for the convenience and brevity of description, specific working processes of the above-described systems, modules and units may be conceived with reference to corresponding processes in the foregoing method embodiments, which will not be repeated herein. It should be understood that the protection scope of the application is not limited to this and any skilled person familiar with the art can easily conceive of various equivalent modifications or substitutions within the technical scope disclosed in this application. These modifications or substitutions should be covered within the protection scope of the application.

It should further be noted that the exemplary embodiments mentioned in the present application describe some method or systems based on a series of steps or means. However, the present application is not limited to the order of the above steps, that is, the steps may be executed in the order described in the embodiments, or in an order different from that in the embodiments, or several steps may be executed simultaneously.

What is claimed is:

1. A display panel motherboard, including a plurality of display panel forming areas distributed in an array and a test area, the display panel motherboard comprising:

an array mother substrate;

a light-emitting layer, disposed on a surface of a side of the array mother substrate and located in the plurality of display panel forming areas; and a test component, disposed on the surface of the array mother substrate and located in the test area, the test component comprising a plurality of test blocks, wherein each test block of the plurality of test blocks comprises:

a fluorescent layer, disposed on the surface of the array mother substrate and emitting light upon being irradiated by activation light;

a target test layer, disposed on the side of the fluorescent layer facing away from the surface of the array mother substrate, and an orthographic projection of the fluorescent layer on the test area covering an orthographic projection of the target test layer on the test area; and a positioning reference portion, disposed at a peripheral side of the target test layer for determining a preset formation position for the target test layer, wherein the light-emitting layer includes a first display area and a second display area disposed at least partially around the first display area, and a pixel density of the first display area is less than a pixel density of the second display area, some test blocks of the plurality of test blocks form a first test group, and a distribution density of the test blocks in the first test group is equivalent to the pixel density of the first display area; and the other test blocks of the plurality of test blocks form a second test group, and a distribution density of the test blocks in the second test group is equivalent to the pixel density of the second display area.

2. The display panel motherboard of claim 1, wherein the light-emitting layer comprises an electron injection layer, an electron transport layer, an organic light-emitting layer, a hole transport layer, and a hole injection layer; and materials forming the fluorescent layer comprise at least one of materials constituting the electron injection layer, materials constituting the electron transport layer, materials constituting the organic light-emitting layer, materials constituting the hole transport material layer, and materials constituting the hole injection layer.

3. The display panel motherboard of claim 1, wherein the positioning reference portion comprises a first positioning component and a second positioning component spaced apart from each other, the first positioning component comprises at least one first positioning portion formed as a cross, and the second positioning component comprises a plurality of second positioning portions each formed as a line.

4. The display panel motherboard of claim 3, wherein the second positioning component comprises three second positioning portions distributed in a triangle layout.

5. The display panel motherboard of claim 3, wherein the target test layer comprises a cathode material layer, a distance from edges of a projection of the cathode material layer on the array mother substrate to corresponding edges of a projection of the fluorescent layer on the array mother substrate as measured anywhere is constant, and the array mother substrate has at least one of the second positioning portions provided at any position next to each edge of the cathode material layer.

6. The display panel motherboard of claim 5, wherein the projection of the cathode material layer on the array mother substrate is a tetragonum, a distance from edges of a tetragonum projection of the cathode material layer on the array mother substrate to corresponding edges of a projection of the fluorescent layer on the array mother substrate as measured anywhere is constant, a center point of the cathode material layer coincides with a center point of the fluorescent layer, and an intersection point of extension lines of two second positioning portions along a first direction and a second direction respectively is set as a preset center point of the target test layer.

7. The display panel motherboard of claim 6, further comprising an anode material layer disposed on the side of the fluorescent layer facing away from the target test layer, and an orthographic projection of the anode material layer on the test area covering the orthographic projection of the fluorescent layer on the test area.

8. The display panel motherboard of claim 3, wherein there are three second positioning portions that are distributed in a triangle layout, to determine a disposing angle of the target test layer with reference to the array mother substrate, an intersection point of extension lines of the second positioning portions along a first direction and a second direction perpendicular to the first direction respectively is set as a preset center point of the target test layer.

9. The display panel motherboard of claim 1, wherein the test area is adjacent to the plurality of display panel forming areas.

10. The display panel motherboard of claim 1, wherein the test area is disposed along one side of the plurality of display panel forming areas.

\* \* \* \* \*